US005877709A

United States Patent [19]
Ala-Lehtimäki et al.

[11] Patent Number: 5,877,709
[45] Date of Patent: Mar. 2, 1999

[54] KEYBOARD ARRANGEMENT AND METHOD FOR IDENTIFYING A PRESSED KEY

[75] Inventors: Timo Ala-Lehtimäki, Oulu; Paavo Niemitalo, Kello, both of Finland

[73] Assignee: Nokia Mobile Phones Ltd., Espoo, Finland

[21] Appl. No.: 943,375

[22] Filed: Oct. 3, 1997

[30] Foreign Application Priority Data

Oct. 4, 1996 [FI] Finland .................................... 963986

[51] Int. Cl.[6] ..................................................... H03N 11/00

[52] U.S. Cl. ......................... 341/26; 341/22; 340/825.79; 379/368

[58] Field of Search ................. 341/26, 22; 340/825.79; 379/368

[56] References Cited

U.S. PATENT DOCUMENTS

| | | | |
|---|---|---|---|
| 4,570,154 | 2/1986 | Kinghorn et al. | 341/26 |
| 4,583,092 | 4/1986 | Saito | 341/26 |
| 4,667,181 | 5/1987 | Hastreiter | 341/26 |
| 4,906,993 | 3/1990 | Freeman et al. | 341/26 |
| 5,266,949 | 11/1993 | Rossi | 341/22 |
| 5,408,060 | 4/1995 | Muurinen | 200/314 |
| 5,554,985 | 9/1996 | Chang | 341/26 |
| 5,668,544 | 9/1997 | Chang et al. | 341/26 |

FOREIGN PATENT DOCUMENTS

07307779 A 11/1995 Japan .

*Primary Examiner*—Michael Horabik
*Assistant Examiner*—Albert K. Wong
*Attorney, Agent, or Firm*—Perman & Green, LLP

[57] ABSTRACT

In a keyboard arrangement and method for identifying a pressed key according to the present invention, conductor lines (4', 6') at each key (B), which may be connected together, are connected to a ground plane (24, 23, 27) as a response to a pressing (P) of a key. The pressed key (B) is identified by detecting the conductor lines that are connected to the ground plane. All the conductor lines may be connected as pulled-up inputs of a detector circuit, and any conductor line or combination of conductor lines may be used to identify a key. A noticeably greater number of keys may be simply identified with the same number of conductor lines than is possible in a solution according to the prior art. In an advantageous embodiment of the present invention, the means for connecting the conductor lines (4', 5', 6', 7') to the ground plane (27) is a conductive plate (23), which essentially covers the whole keyboard. This also provides a good shield against electrostatic discharges and other interference.

10 Claims, 3 Drawing Sheets

KEYBOARD ARRANGEMENT AND METHOD FOR IDENTIFYING A PRESSED KEY

A keyboard arrangement and method for identifying a pressed key

The present invention is related to a keyboard arrangement, and particularly a keyboard arrangement in which several conductor lines are arranged so that, corresponding to each key, certain conductor lines may be connected together. The present invention is also related to a method for identifying a pressed key in such a keyboard arrangement.

Figure 1:
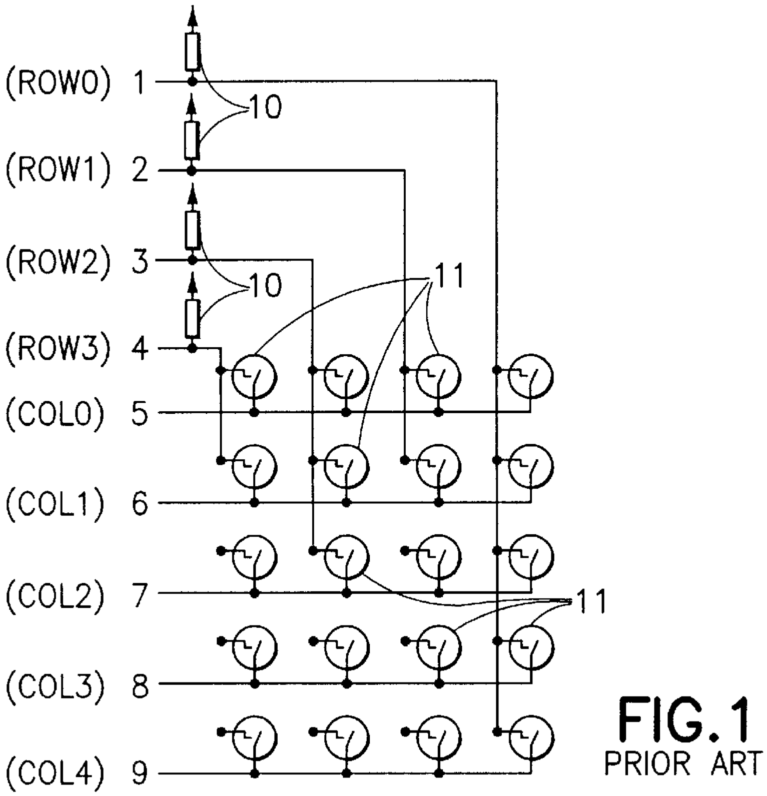
FIG. 1 PRIOR ART

FIG. 1 illustrates a keyboard arrangement of this type that is realized according to the prior art. A keyboard matrix has separate output lines, here COL0—COL4, and input lines, here ROW0—ROW3, which are pulled-up inputs of a detector circuit (not shown), as indicated by reference number 10. When a key is pressed, switching means 11 connects a certain output line and a certain input line together, causing an interruption in said input line. Then a keyboard matrix scanning process begins where the output lines are written down by turn, and the status of the input lines is read each time. In this way the pressed key is finally identified. As is apparent from FIG. 1, the number of keys that may be detected by means of this type of arrangement is equal to the product of the number of output and input lines. In the arrangement of FIG. 1, 20 keys may be detected by five output lines and four input lines, a total of nine lines 1–9.

A purpose of the present invention is to produce a functionally and structurally simpler solution for realizing a keyboard arrangement of this type. In the solution according to the prior art shown in FIG. 1, detection of a pressed key by means of scanning is relatively time-consuming and the scanning software consumes memory capacity. The purpose of the present invention is to simplify detection of a pressed key. Another purpose of the present invention is to produce a keyboard arrangement that is well shielded against electrostatic discharges (ESD) and other electromagnetic interference (EMI). Electrostatic discharges may cause interference in mobile phones, for example, and most discharges of this type have been shown to enter a phone through the keyboard.

Resistors and capacitors have been added to the conductor lines of keyboard printed circuit boards to shield against the effects of electrostatic discharges in a mobile phone. A Japanese patent application publication 07307779 deals with a solution in which a rubber key mat on a keyboard substrate is surrounded by a metal plate connected to the ground plane of the substrate. The metal plate is only a shield, and it is not related to the operation of the keyboard.

A keyboard arrangement according to the present invention, which includes:

- a keyboard, which comprises several keys,
- a conductor pattern in which several conductor lines are arranged so that at each key certain conductor lines may be connected together,
- means at each key for connecting said certain conductor lines together as a response to a pressing of the key,
- a ground plane and
- a detector circuit to which the conductor lines and ground plane are connected, is characterized in that the means at each key for connecting the conductor lines together are means for connecting said conductor lines to the ground plane in response to a pressing of the key.

In one embodiment of the present invention, the connecting means are a conductive plate-like part, which is connected to the ground plane and essentially covers the whole keyboard. The part may be a metal plate or a conductive plastic plate. This implementation also provides excellent protection against electrostatic discharges and other interference. Another benefit, for example, when different mobile phone models have different keyboard layouts, is that a single printed circuit board may be realized having conductor patterns for the keyboard layouts of different models, and each model utilizes only its own switch board.

In one embodiment of the present invention, the conductor lines of the conductor pattern are pulled-up inputs of a detector circuit, whereupon, as a response to any conductor line being connected to ground it is possible to detect the conductor lines that are connected to the ground plane and thereby identify the key that was pressed.

A method according to the present invention for identifying a pressed key in a keyboard arrangement, which includes:

- a keyboard, which comprises several keys,
- a conductor pattern in which several conductor lines are arranged so that distinctly corresponding to each key, certain conductor lines may be connected together, and
- a ground plane separated from the conductor lines, and in which method the status of the conductor lines is examined, is characterized in that:

- said certain conductor lines are connected to the ground plane as a response to a pressing of said key, and
- the conductor lines that are connected to the ground plane are detected and the corresponding key is thus identified.

In one embodiment of the method, the status of the conductor lines is examined by means of a detector circuit to which the conductor lines are connected as pulled-up inputs, and as a response to one of the conductor lines being connected to ground, the status of all the conductor lines is examined, and the key corresponding to the conductor lines that are connected to the ground plane is thus identified.

In another embodiment of the method, the conductor lines are continuously polled, and the conductor lines that are connected to the ground plane are thus detected.

If a key is identified by pulling down two lines, with n lines $n*(n-1)/2$ keys can be identified. This is clearly more than the number of keys that can be identified by means of the solution according to the prior art described above. In principle, it is just as easy to identify any combination of pulled-down lines by implementing the method of the present invention. Thus, a key can be identified based on just one or, for example, three or four pulled-down lines. Therefore, it is possible to further increase the number of keys identifiable with the same number of lines.

The present invention and certain of its embodiments are explained in more detail in the following, with references to the enclosed drawings.

Figure 2:
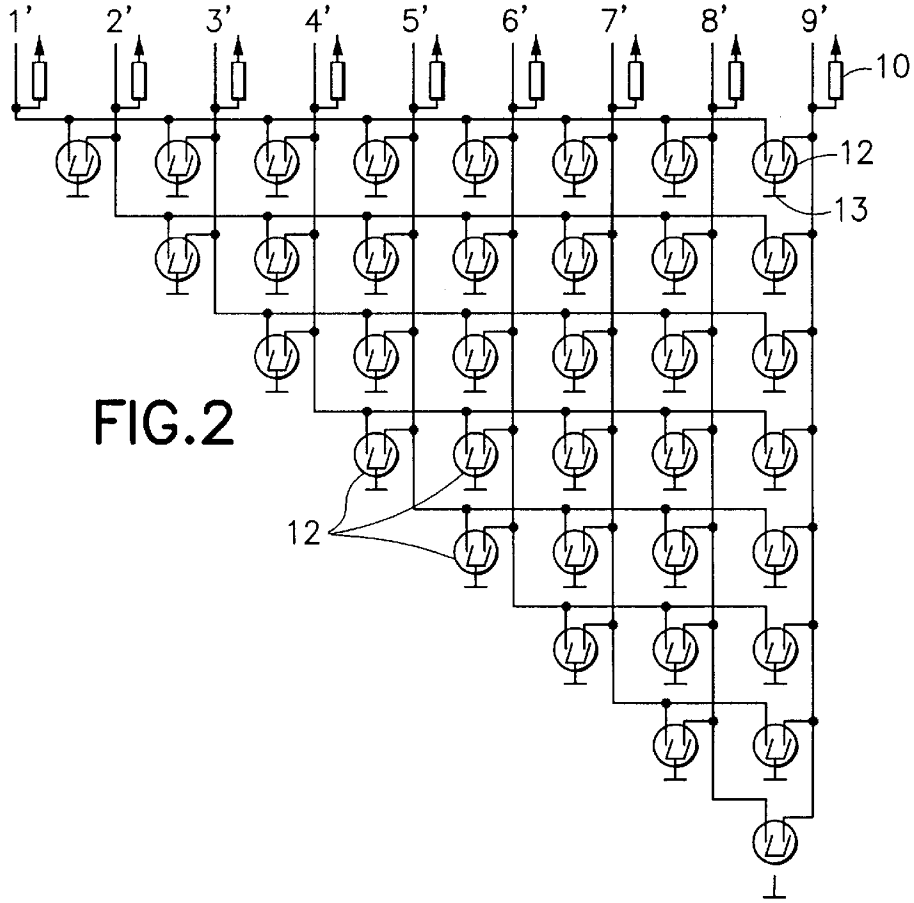
Figure 3:
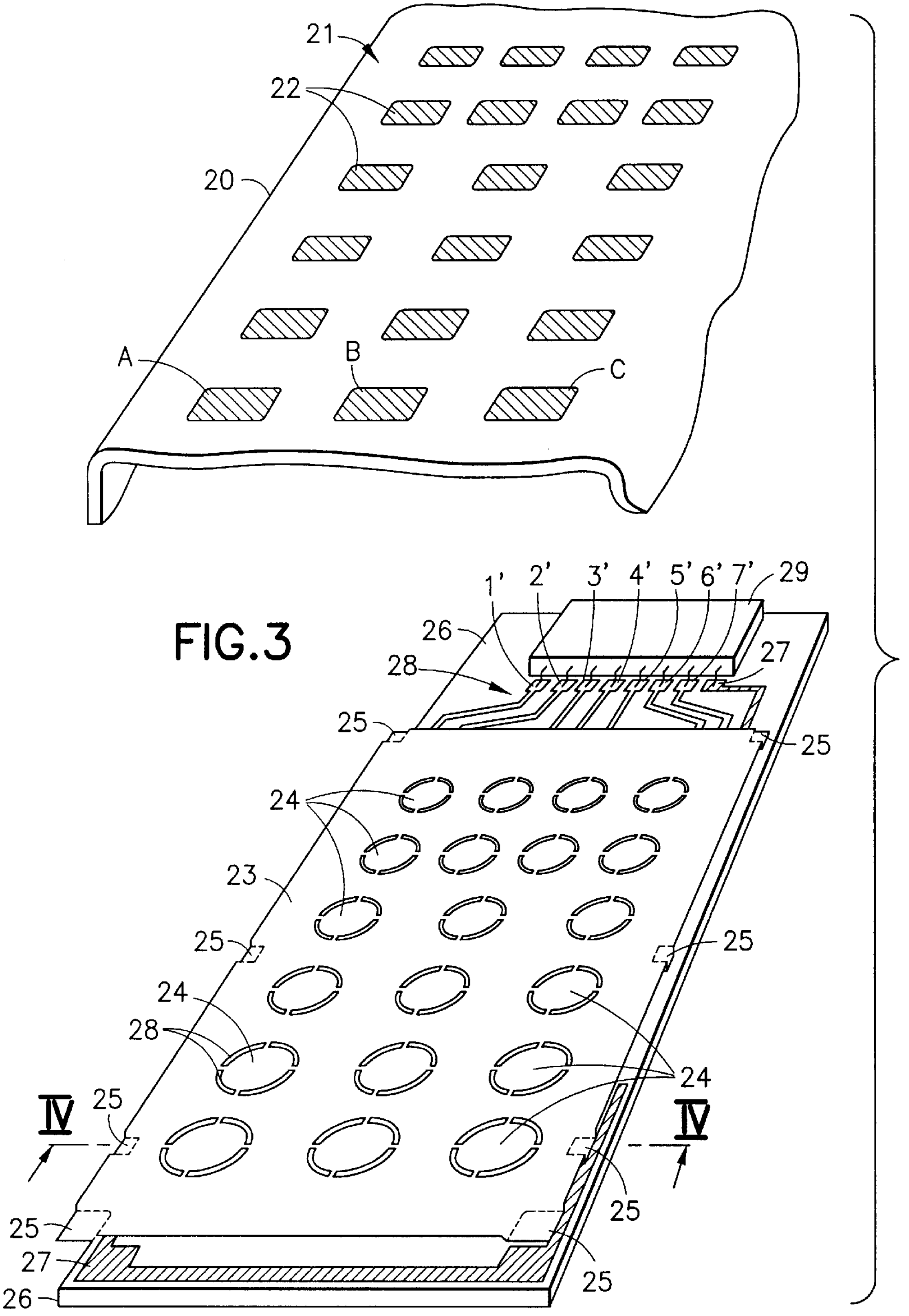
Figure 4:
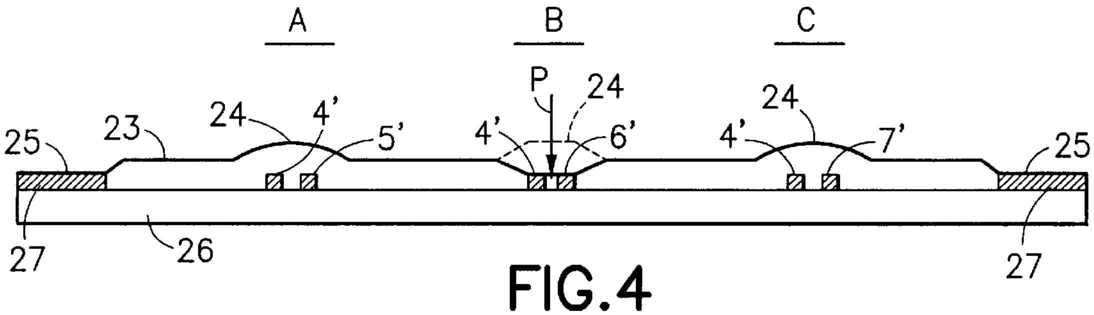

FIG. 1 presents a circuit diagram of a keyboard arrangement according to the prior art, FIG. 2 presents a circuit diagram of a keyboard arrangement according to the present invention corresponding to the keyboard arrangement of FIG. 1, FIG. 3 presents a diagrammatic perspective view of an embodiment of a keyboard arrangement according to the present invention and FIG. 4 is a diagrammatic cross-sectional view from IV—IV of FIG. 3.

A keyboard arrangement according to the prior art illustrated in FIG. 1 is explained above. FIG. 2 presents a circuit diagram of a comparable keyboard arrangement according to the present invention, which, like the solution in FIG. 1, is based on nine conductor lines 1'–9'. Here all the conductor lines are fitted with pull-up resistors 10, and they are pulled-up inputs of a detector circuit (not shown). The diagrammatically presented conductor pattern is arranged so that all possible pairs of conductor lines pass close to each other at a location where they may be connected together. Each said location is fitted with means to connect said conductor lines to a ground plane as a response to a pressing of a corresponding key. Said means are pictured as switches 12, which are capable of connecting the conductor lines to the ground plane 13. A key can be identified as follows, for example: an interruption is created in the detector circuit when any one of the conductor lines 1'–9' is connected to ground, after which the status of all the lines is read and the key that was pressed is determined. Nine lines are used here to identify 36 keys, while correspondingly only 20 keys could be identified using the keyboard arrangement of FIG. 1.

FIG. 3 diagrammatically presents an embodiment of a keyboard arrangement according to the present invention. Part of the shell of a mobile phone 20 and its keyboard 21, which comprises 20 keys, are diagrammatically shown at the top. The keyboard is placed over the arrangement shown at the bottom so that each key 22 lines up with a corresponding round zone 24. The keys have a known structure or other structure by which a key exerts a force on a zone 24 of the plate 23 below it when pressed. Three keys in the bottom row, which are indicated with markings A, B and C, are examined in more detail later. The plate 23, which is a conductive plate connected to a ground plane, covers the whole keyboard and thus forms a good shield against electrostatic discharges and other electromagnetic interference. Underneath the plate is a printed circuit board 26 that has a conductor pattern 28 comprising conductor lines 1'–7' and a ground plane 27. A detector circuit 29 is shown installed on the same printed circuit board, and the conductor lines 1'–7' are connected to the detector circuit as pulled-up inputs. The plate 23 is a thin metal plate from which each key zone 24 is separated by means of curved openings so that only thin strips connect the key zones to the metal plate. The zones 24 are dome-shaped. The plate also has protruding embossments 25 formed by punching, for example, on its bottom side, which come into contact with corresponding regions 27 of the ground plane of the printed circuit board 26 when the plate 23 is installed and fastened in place.

FIG. 4 shows a diagrammatic cross-sectional view from IV—IV of FIG. 3, which illustrates the functioning of a keyboard arrangement according to the present invention in more detail. Lines 4', 5'; 4', 6' and 4', 7' of the conductor pattern of printed circuit board 26 are shown as examples underneath corresponding keys A, B and C and zones 24. Metal plate 23 is supported by embossments 25, which contact ground plane regions of the printed circuit board 26. In practice, the plate 23 may be kept apart from the conductor pattern of the printed circuit board by other means than embossments that contact the ground plane or similar supporting means. It is also possible that the plate 23 is rests against an ordinary isolation layer, such as a solder resist coating, which covers most of the conductor pattern. An isolating plate with openings corresponding to the key zones may be located between the plate 23 and the printed circuit board comprising a conductor pattern. The zones 24 of plate 23 corresponding to the keys are dome-shaped. When a key B is pressed, a force P is exerted against a zone 24, the zone 24 bends downward and connects conductor lines 4' and 6' together and to the ground plane 27. The detector circuit 29 detects the conductor lines 4' and 6' connected to the ground plane (27), and thus identifies the pressed key as B.

The following paragraph contains a brief explanation, with references to FIGS. 2, 3 and 4, of a method according to the present invention for identifying a key in the keyboard arrangement described above, in which conductor lines (1'–7') are arranged so that certain conductor lines (4', 5'; 4', 6'; 4', 7') distinctly corresponding to each key (A, B, C) may be connected together (FIG. 4). FIG. 2 illustrates the method in a case where each key distinctly corresponds to a certain two out of nine conductor lines 1'–9'. In the method according to the present invention, said certain conductor lines (4', 6') are connected to the ground plane (27) (FIG. 4), as a response to a pressing (P) of a key B. The pressed key B is identified by detecting the lines (4', 6') connected to the ground plane. In an embodiment of the method, the status of the conductor lines (1'–7') is examined by means of a detector circuit (29) (FIG. 3), to which the conductor lines are connected as pulled-up inputs as shown by reference number 10 in FIG. 2. As a response to a conductor line being connected to ground, the status of all the conductor lines is examined, thus identifying the key corresponding to the conductor lines connected to the ground plane. This may be realized so that connecting any one of the conductor lines to ground causes an interruption in the detector circuit 29, after which the circuit examines which conductor lines are at ground potential. The method according to the present invention may also be realized by continuously polling the conductor lines, thus detecting which conductor lines are connected to the ground plane at a given moment.

Certain embodiments of the present invention have been described above, but it is clear that the present invention is not limited to said embodiments. An expert in the field understands that, for example, the means by which the conductor lines are connected to the ground plane may be realized in many different ways. The metal plate may be replaced by metallized plastic or plastic-based conductive polymer, for example. The shape and operating mechanism of the means may also vary. It is essential that the conductor lines corresponding to a key may be connected to a ground plane as a response to a pressing of the key. The base on which the conductor lines are formed may be advantageously realized by means of conventional printed circuit board technology, but it is clear that many other technologies for forming conductor patterns may also be used.

A special detector circuit is presented above, whose inputs are the conductor lines. In practice, in a mobile phone, for example, the detector circuit is integrated in an ASIC component, which also performs many other functions. The detector circuit may just as easily be located on a separate printed circuit board than the one on which the keyboard conductor pattern is located.

The primary application of the present invention is a mobile phone, but it is clear that the keyboard arrangement according to the present invention also provides noticeable benefits in many other devices.

The present invention may vary within the limits of the enclosed claims.

We claim:

1. A keyboard arrangement, which includes:

a keyboard (21), which comprises several keys (22), a conductor pattern (28) in which several conductor lines (1'–7') are arranged so that at each key certain conductor lines (4', 5'; 4', 6'; 4', 7') may be connected together, means (24) at each key (A, B, C) for connecting said certain conductor lines together as a response to a pressing (P) of a key (B), a ground plane (27), and a detector circuit (29) to which the conductor lines (1'–7') and ground plane (27) are connected, characterized in that the means at each key for connecting the conductor lines together are means (12, 24) for connecting said conductor lines (4', 6') directly to the ground plane (27) in response to a pressing (P) of the key (B).

2. The keyboard arrangement according to claim 1, characterized in that the connecting means is a conductive plate-like part (23), which is connected to the ground plane (27) and which essentially covers the whole keyboard (21).

3. The keyboard arrangement according to claim 2, characterized in that the conductive plate-like part (23) is a metal plate.

4. The keyboard arrangement according to claim 2, characterized in that the conductive plate-like part (23) is a conductive plastic plate.

5. The keyboard arrangement according to claim 1, characterized in that the conductor lines (1'–7') of the conductor pattern (28) are pulled-up inputs of a detector circuit (29), whereupon, as a response to any conductor line being connected to ground, the detector circuit (29) detects the conductor lines that are connected to the ground plane and thereby identifies the key that was pressed.

6. The keyboard arrangement according to claim 1, characterized in that the conductor line (1'–7') of the conductor pattern (28) are pulled-up inputs of the detector circuit (29), which inputs the detector circuit (29) continuously monitors in order to detect conductor lines that are connected to the ground plane and thus identify a pressed key.

7. A mobile phone that contains a keyboard arrangement according to claim 1.

8. A method for identifying a pressed key in a keyboard arrangement, which includes:

a keyboard (21), which comprises several keys (22), a conductor pattern (28) in which several conductor lines (1'–7') are arranged so that distinctly corresponding to each key (A, B, C), certain conductor lines (4', 5'; 4', 6'; 4', 7') may be connected together and a ground plane (27) separated from the conductor lines, and in which method the status of the conductor lines is examined, characterized in that:

said certain conductor lines (4', 6') are connected to the ground plane (27) as a response to a pressing (P) of key (B), and the conductor lines (4', 6') that are connected to the ground plane (27) are detected and the corresponding key (B) is thus identified.

9. The method according to claim 8, characterized in that the status of the conductor lines (1'–7') is examined by means of a detector circuit (29) to which the conductor lines are connected as pulled-up inputs, as a response to one of the conductor lines being connected to ground, the status of all the conductor lines is examined, and the key corresponding to the conductor lines that are connected to the ground plane is thus identified.

10. The method according to claim 8, characterized in that the conductor lines (1'–7') are continuously polled, and the conductor lines that are connected to the ground plane are thus detected.

* * * * *